(12) United States Patent
Sugiyama et al.

(10) Patent No.: US 9,397,628 B2
(45) Date of Patent: Jul. 19, 2016

(54) ELECTRONIC DEVICE, CONTROLLING METHOD AND CONTROLLING PROGRAM FOR ELECTRONIC DEVICE, AND RECORDING MEDIUM

(75) Inventors: Juri Sugiyama, Osaka (JP); Taku Ueno, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 545 days.

(21) Appl. No.: 13/878,428

(22) PCT Filed: Feb. 16, 2012

(86) PCT No.: PCT/JP2012/053641
§ 371 (c)(1),
(2), (4) Date: Apr. 9, 2013

(87) PCT Pub. No.: WO2012/111740
PCT Pub. Date: Aug. 23, 2012

(65) Prior Publication Data
US 2013/0195280 A1     Aug. 1, 2013

(30) Foreign Application Priority Data

Feb. 17, 2011  (JP) .................................. 2011-032517

(51) Int. Cl.
*H03G 3/00* (2006.01)
*H04M 1/60* (2006.01)
*H04M 1/725* (2006.01)
*G06F 3/16* (2006.01)

(52) U.S. Cl.
CPC .................. *H03G 3/00* (2013.01); *G06F 3/165* (2013.01); *H04M 1/60* (2013.01); *H04M 1/72519* (2013.01)

(58) Field of Classification Search
CPC ..... H04M 1/60; H04M 1/72519; G06F 3/165; H03G 3/00

USPC ........ 381/56, 57, 104, 107, 108, 93, 83, 94.1; 455/570, 123, 125, 233.1, 234.1, 455/234.2, 256, 257

See application file for complete search history.

(56) References Cited

U.S. PATENT DOCUMENTS

| | | | |
|---|---|---|---|
| 6,360,187 B1 * | 3/2002 | Hermann | 702/191 |
| 7,996,048 B1 * | 8/2011 | Mikan et al. | 455/570 |
| 8,903,097 B2 * | 12/2014 | Kemmochi | 381/57 |

FOREIGN PATENT DOCUMENTS

| | | |
|---|---|---|
| AU | 755658 B2 | 7/1999 |
| EP | 0929174 A2 | 7/1999 |

(Continued)

OTHER PUBLICATIONS

International Search Report issued in PCT/JP2012/053641, mailed on Apr. 17, 2012.

*Primary Examiner* — David Ton
(74) *Attorney, Agent, or Firm* — Birch, Stewart, Kolasch & Birch, LLP

(57) ABSTRACT

An electronic device includes (i) an input-volume measuring section (23) for measuring input volume, which is volume of a sound inputted into the sound input section (17) while the sound output section (16) is performing sound output, (ii) a feedback-volume estimating section (24) for estimating estimated volume, estimated volume is volume of a sound which is to be inputted into the sound input section (17) in a state in which there is no object which blocks the sound in a predetermined range, (iii) volume determination section (26) for determining whether or not the input volume is lower than the estimated volume, and (iv) a function control section (21) for carrying out a predetermined process if the input volume is lower than the estimated volume.

8 Claims, 9 Drawing Sheets

(56) References Cited

FOREIGN PATENT DOCUMENTS

| JP | 10-79978 A | 3/1998 |
| JP | 11-205199 A | 7/1999 |
| JP | 2003-319018 A | 11/2003 |
| JP | 2005-244579 A | 9/2005 |
| JP | 2008-271062 A | 11/2008 |
| JP | 2010-258701 A | 11/2010 |

* cited by examiner

FIG. 3

| DETERMINATION RESULT | PROCESS UNDER OPERERATION | PROCESS TO BE CARRIED OUT |
|---|---|---|
| Input volume is lower than estimated volume | Process for receiving call | Lower volume |
| | Process for carrying out game A | Carry out the same process as the process when entry key is pressed |
| | ⋮ | ⋮ |

FIG. 4

| DETERMINATION RESULT | PROCESS UNDER OPERERATION | PROCESS TO BE CARRIED OUT |
|---|---|---|
| Sound output section or sound input section is not in normal state | Process for receiving call | Raise volume |
| | Process for carrying out game A | Display ERROR notice |
| | ⋮ | ⋮ |

ELECTRONIC DEVICE, CONTROLLING METHOD AND CONTROLLING PROGRAM FOR ELECTRONIC DEVICE, AND RECORDING MEDIUM

TECHNICAL FIELD

The present invention relates to (i) an electronic device including a sound output section and a sound input section, (ii) a controlling method and a controlling program for the electronic device and (iii) a recording medium.

BACKGROUND ART

In recent years, there is such a trend that mobile terminals such as portable phones etc. are designed with fewer physical keys for the sake of their design qualities, operability and costs etc. In addition, generally, an operation section, such as a key is preferably arranged so as to be controlled intuitively, whereby even a person who uses a device for the first time can control the device easily.

For example, some portable phones are equipped with a touch panel display covering its front without having an operation section such as a numeric keypad.

CITATION LIST

Patent Literature

Patent Literature 1
Japanese Patent Application Publication, Tokukaihei, No. 10-79978 A (Publication Date: Mar. 24, 1998)

SUMMARY OF INVENTION

Technical Problem

However, such a portable phone described above has not succeeded in substantially decreasing the number of keys since such a portable phone is merely configured to utilize a touch panel instead of a numeric keypad in order to mainly enhance its design qualities. Since such a touch panel merely displays the numeric keypad etc. on its display as pseudo-numeric keypad etc., it does not allow a user to control the portable phone more intuitively than conventional portable phones.

For example, the conventional portable phones may encounter a case where the user's portable phone receives a call, but the user would like to silence a ringtone without answering the call. In such a case, a user who is not familiar with controlling the portable phone cannot instantly turn down volume of the ringtone because the user does not know intuitively which key is to be pressed in order to turn down volume of (silence) the ringtone.

Patent Literature 1 describes a call device provided separately from a portable phone. The call device is configured to (i) detect an incoming call by a sound detecting section, which covers a speaker of the portable phone and (ii) informs a user of reception of the incoming call upon receiving a detection signal from the sound detecting section. However, the use of the technique described in Patent Literature 1 merely makes such a change that it only allows a ringtone to be outputted from the call device instead of being outputted from the portable phone at receiving a call. After all, a user who is not familiar with controlling the call device does not know intuitively which key is to be pressed in order to turn down the volume of (silence) the ringtone. Furthermore, the technique described in Patent Literature 1 does not physically reduce the number of operation sections, such as keys.

The present invention has been made in view of the above problems, and an object of the present invention is to realize (i) an electronic device which has a fewer operation sections, such as keys, (ii) a controlling method and a controlling program for the electronic device, and (iii) a recording medium.

Solution to Problem

In order to attain the above object, an electronic device in accordance with the present invention is an electronic device including a sound output section and a sound input section, includes (i) input-volume measuring means for measuring input volume, which is volume of a sound inputted into the sound input section while the sound output section is performing sound output, (ii) feedback-volume estimating means for estimating estimated volume in a reference state, estimated volume being volume of a sound outputted from the sound output section and is to be inputted into the sound input section, and the reference state being a state in which there is no object which blocks the sound outputted from the sound output section and is to be collected by the sound input section in a predetermined range defined by a position of one of the sound output section and the sound input section, (iii) volume determination means for determining whether or not the input volume measured by the input-volume measuring means is lower than the estimated volume estimated by the feedback-volume estimating means, and (iv) device function control means for carrying out a predetermined first process if the volume determination means determines that the input volume is lower than the estimated volume.

In order to attain the above object, a controlling method for an electronic device in accordance with the present invention is a controlling method for an electronic device including a sound output section and a sound input section, includes the steps of, (a) performing input-volume measurement for measuring input volume, which is volume of a sound inputted into the sound input section while the sound output section is performing sound output, (b) performing feedback-volume estimate for estimating estimated volume in a reference state, estimated volume being volume of a sound outputted from the sound output section and is to be inputted into the sound input section, and the reference state being a state in which there is no object which blocks the sound outputted from the sound output section and is to be collected by the sound input section in a predetermined range defined by a position of one of the sound output section and the sound input section, (c) performing volume determination for determining whether or not the input volume measured in the step (a) is lower than the estimated volume estimated in the step (b), and (d) performing device function control for carrying out a predetermined first process if the step (c) determines that the input volume is lower than the estimated volume in the step (c).

According to the above configuration, the feedback-volume estimating means estimates volume of a sound outputted from the sound output section and is to be inputted into the sound input section in the reference state in which there is no object which blocks the sound outputted from the sound output section on a route from the sound output section to the sound input section while the sound is propagating in the predetermined range defined by a position of one of the sound output section and the sound input section. That is, in the reference state in which there is no object which blocks the sound outputted from the sound output section while the input-volume measuring means is measuring the volume of the sound in the predetermined range defined by the position of one of the sound output section and the sound input section, a value of the input volume is substantially equal to a value of the estimated volume. On the other hand, in a state in which there is an object which blocks a sound outputted from the sound output section while the input-volume measuring means is measuring the volume of the sound in the predetermined range defined by the position of one of the sound output section and the sound input section, the input volume is lower than the estimated volume since a sound inputted into the sound input section is to decline.

Note, here, that, by determining whether or not the input volume is lower than the estimated volume, the volume determination means can eventually determine whether it is (i) in a state in which there is the object which blocks the sound outputted from the sound output section in the predetermined range defined by the position of one of the sound output section and the sound input section or it is (ii) in the reference state in which there is no such an object in the predetermined range. This makes it possible for the device function control means to carry out the predetermined first process in a case where there is the object which blocks the sound outputted from the sound output section in the predetermined range defined by the position of one of the sound output section and the sound input section.

For example, as a state in which there is the object which blocks the sound outputted from the sound output section in the predetermined range defined by the position of one of the sound output section and the sound input section, there is a case, for example, in which a user covers the sound output section or the sound input section with the user's finger etc. In such a case, the device function control means carries out the predetermined first process if the user covers the sound output section or the sound input section with the user's finger etc.

Accordingly, it is possible to cause each of the sound output section and the sound input section to serve as an operation section which receives an input from a user. Therefore, it makes possible to reduce the number of physical operation sections of an electronic device.

Furthermore, for example, in a case where such an electronic device is a portable phone, it is assumed that the device function control means turns down volume of a ringtone after the volume determination means has determined that the input volume has been lower than the estimated volume while the portable phone is receiving a call. In such a case, if a user would like to silence the ringtone while receiving a call, the user can turn down volume of the ringtone outputted from the sound output section by pressing the sound output section with the user's finger in order to prevent the ringtone from leaking outside.

In this manner, the electronic device turns down volume of an output sound if the sound output section is covered. This makes it possible for a user to control the sound output section which serves as the operation section intuitively.

Note, the electronic device can be realized in a computer, and in this case, by causing the computer to serve as the various means of the electronic device, the present invention includes (i) a controlling program in which the electronic device is realized in the computer and (ii) a recording medium which can be read by a computer storing the controlling program.

Advantageous Effects of Invention

As described above, an electronic device in accordance with the present invention includes (i) input-volume measuring means for measuring input volume, which is volume of a sound inputted into the sound input section while the sound output section is performing sound output, (ii) feedback-volume estimating means for estimating estimated volume in a reference state, estimated volume being volume of a sound outputted from the sound output section and is to be inputted into the sound input section, and the reference state being a state in which there is no object which blocks the sound outputted from the sound output section between the sound output section and the sound input section, (iii) volume determination means for determining whether or not the input volume measured by the input-volume measuring means is lower than the estimated volume estimated by the feedback-volume estimating means, and (iv) device function control means for carrying out a predetermined first process if the volume determination means determines that the input volume is lower than the estimated volume.

Furthermore, a controlling method of an electronic device in accordance with the present invention includes the steps of, (a) performing input-volume measurement for measuring input volume, which is volume of a sound inputted into the sound input section while the sound output section is performing sound output, (b) performing feedback-volume estimate for estimating estimated volume in a reference state, estimated volume being volume of a sound outputted from the sound output section and is to be inputted into the sound input section, and the reference state being a state in which there is no object which blocks the sound outputted from the sound output section between the sound output section and the sound input section, (c) performing volume determination for determining whether or not the input volume measured in the step (a) is lower than the estimated volume estimated in the step (b), and (d) performing device function control for carrying out a predetermined first process if the step (c) determines that the input volume is lower than the estimated volume in the step (c).

Accordingly, it is possible to cause each of the sound output section and the sound input section to serve as an operation section which receives an input from a user. Therefore, it makes possible to reduce the number of physical operation sections of an electronic device.

BRIEF DESCRIPTION OF DRAWINGS

FIG. 3 is a view showing an example of a switch-function operation table stored in a storage section of the portable phone.

FIG. 4 is a view showing an example of an abnormal-state operation table stored in the storage section of the portable phone.

DESCRIPTION OF EMBODIMENTS

Outline of Present Invention

As described above, a user who is not familiar with controlling a portable phone does not know which key is to be covered in order to turn down volume of (silence) a ringtone. In such a case, such a user is likely to cover a speaker with the user's finger in order to prevent the ringtone from leaking outside at receiving a call. The inventors of the present invention considered that it would become possible for the user to control the portable phone intuitively if a sound output from the speaker can be actually controlled to be stopped when the user covers the speaker with the user's finger etc. as described above. In addition, the sound outputted from the speaker is collected by a microphone so that (i) an output sound outputted while the speaker is being covered with a finger etc. is distinguished from (ii) an output sound outputted while the speaker is not being covered with a finger etc. The inventors of the present invention considered that this configuration would make it unnecessary for the portable phone to have an additional component such as a sensor or a key in order to detect that the speaker is being covered.

In other words, according to the present invention, a portable phone including a speaker and a microphone is configured to allow at least one of the speaker and the microphone to serve as a switch of the portable phone.

Note, however, that a portable phone is an example of application of the present invention, and the present invention can be applied to any electronic devices provided that the electronic devices include a sound output section (speaker) and a sound input section (microphone). Examples of such electronic devices include TVs, audio devices, portable music players, voice recorders, portable video games, video game consoles, personal computers and the like.

Embodiment 1

Embodiment 1 of the present invention is described below with reference to FIG. 1 to FIG. 8.

[External Appearance of Portable Phone]

Figure 2:
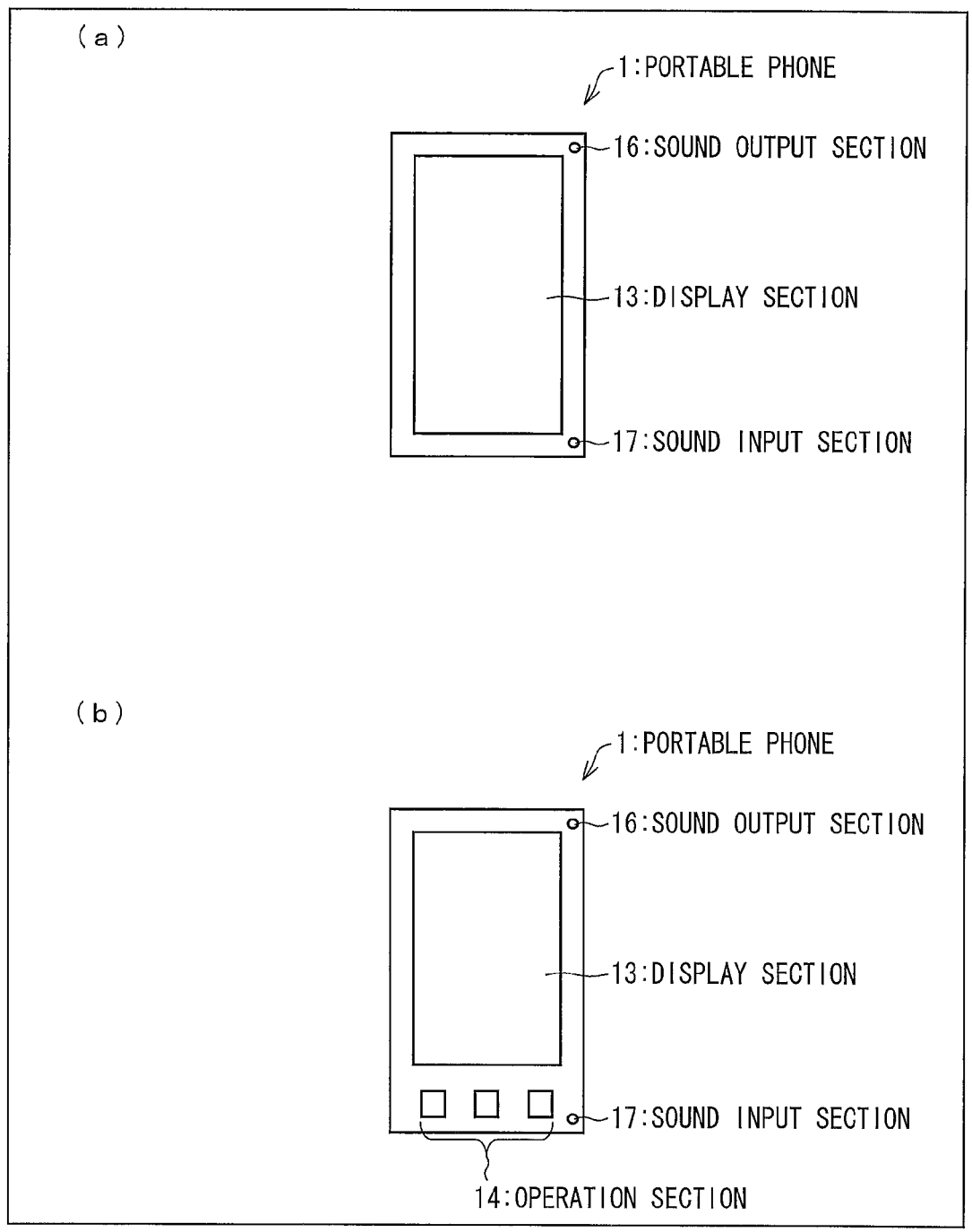
FIG. 2 is a view showing an external appearance of the portable phone.

FIG. 2 is a view showing an example of an external appearance of a portable phone 1. (a) of FIG. 2 is a view showing an example of an external appearance of the portable phone 1 including a display section 13 which is a touch panel. (b) of FIG. 2 is a view showing an example of an external appearance of the portable phone 1 including the display section 13 and an operation section 14 separately. (a) and (b) of FIG. 2 are views each showing the external appearance of the portable phone 1 seen from a front of the portable phone 1.

In the example shown in (a) of FIG. 2, the display section 13, a sound output section 16 and a sound input section 17 are provided on a front surface of the portable phone 1. In the example shown in (b) of FIG. 2, the display section 13, the operation section 14, the sound output section 16 and the sound input section 17 are provided on the front surface of the portable phone 1. Note, however, that these members included in the portable phone 1 can be appropriately provided in any position, which is not limited to the arrangement of the example shown in FIG. 2.

Furthermore, according to each of the example shown in (a) and (b) of FIG. 2, the portable phone 1 has a single sound output section 16 and a single sound input section 17. Note, however, that the present invention is not limited to this example. For example, the portable phone 1 can include a plurality of sound output sections 16 and sound input sections 17. In the present invention, it is only necessary for the portable phone 1 to include at least one (1) sound output section 16 and at least one (1) sound input section 17.

[Configuration of Portable Phone]

Figure 1:
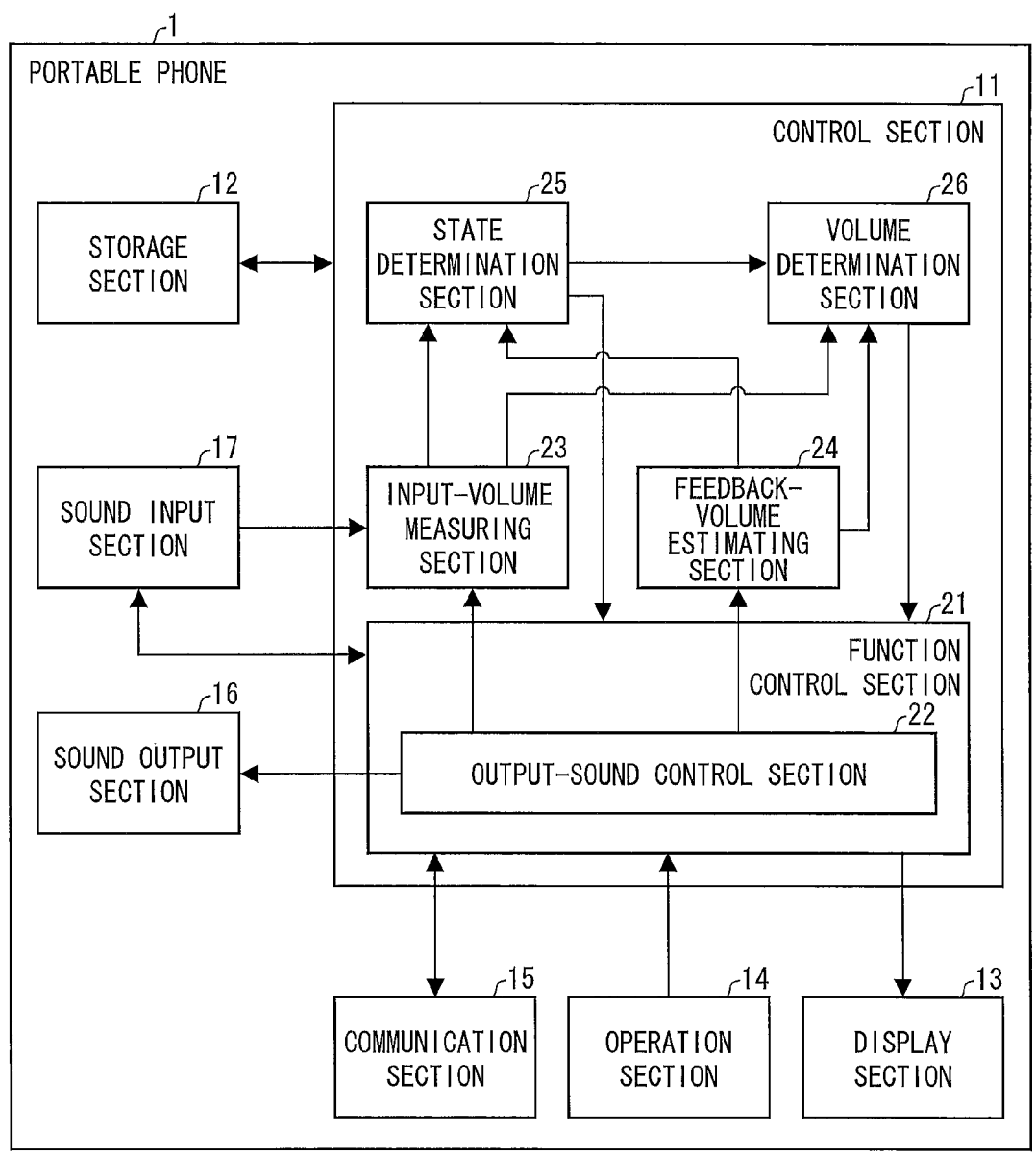
FIG. 1 is a block diagram showing a configuration of main parts of a portable phone in accordance with Embodiment 1 of the present invention.

FIG. 1 is a block diagram showing a configuration of main parts of the portable phone 1. As shown in FIG. 1, the portable phone 1 includes a control section 11, a storage section 12, the display section 13, the operation section 14, a communication section 15, the sound output section 16 and the sound input section 17.

The display section 13 displays an image in accordance with an indication of the control section 11. Displays such as an LCD (liquid crystal display), an organic EL display and a plasma display and the like are applicable to the display section 13 provided that these displays can display images in accordance with the indication of the control section 11.

The operation section 14 is a section for allowing a user to input an instruction signal into the portable phone 1 so as to control the portable phone 1. The operation section 14 can be configured by an on-hook key, an off-hook key, a function key, a cross key and a numeric keypad and/or the like. Alternatively, the operation section 14 can be a touch panel in which the operation section 14 and the display section 13 are integrated as in the portable phone 1 shown in (a) of FIG. 2.

The communication section 15 is a section for communicating with another device via wireless communication means or wire communication means and for exchanging data under instructions from the control section 11.

The sound output section 16 is a section for receiving an electric signal from the control section 11 and converting the received electric signal into a sound so as to output the sound outside the portable phone 1. The sound output section 16 is what is called a speaker.

The sound input section 17 is a section for collecting sounds around the portable phone 1 and converting the collected sounds into electric signals so as to output the electric signals to the control section 11. The sound input section 17 is what is called a microphone.

The control section 11 is a section for (i) running a program read out from the storage section 12 to a temporary storage section (not shown) so as to perform various mathematical operations and (ii) controlling each members included in the portable phone 1 in an integrated manner.

In this embodiment, the control section 11 is configured such that it includes, as function blocks, a function control section (device function control means) 21, an input-volume measuring section (input-volume measuring means) 23, a feedback volume estimating section (feedback-volume estimating means) 24, a state determination section (state determination means) 25 and a volume determination section (volume determination means) 26. Furthermore, the function control section 21 includes an output-sound control section 22. Each of the function blocks (21 to 26) of the control section 11 can be realized when a CPU (central processing unit) runs a program read out to the temporary storage section which is realized by such as RAM (random access memory), from a storage device which is realized by such as ROM (read only memory) and stores the program therein.

The function control section 21 controls functions of the portable phone 1. For example, the function control section 21 (i) controls processes of, such as power ON/OFF, a call, a mail, Web reading, and executing other applications, (ii) carries out various processes in accordance with a user's instruction inputted via the operation section 14, (iii) causes the display section 13 to display an image if and as required by a process, and (iv) receives an electric signal from the sound input section 17, for example during a call, and transmits the received electric signal to another device via the communication section 15.

Furthermore, the function control section 21 switches ON/OFF of switch functions of each of the sound output section 16 and the sound input section 17. Note, that a trigger which causes the function control section 21 to switch the switch functions is not particularly limited. For example, the function control section 21 may be arranged to switch ON/OFF of the switch functions in accordance with the user's instruction inputted via the operation section 14. Alternatively, the function control section 21 may be arranged to switch ON/OFF of the switch functions (i) when predetermined application is activated or (ii) when a predetermined process of a predetermined application is carried out. As a concrete example, the function control section 21 (i) may be arranged to turn on the switch functions to work when an incoming call process of a call function starts and (ii) may be arranged to turn off the switch functions when the incoming call process ends. Alternatively, the function control section 21 (i) may be arranged to turn on the switch functions when the output-sound control section 22 (described later) causes the sound output section 16 to output a sound and (ii) may be configured to turn off the switch functions at the same time when the output-sound control section 22 causes the sound output section 16 to stop outputting the sound.

The function control section 21 includes the output-sound control section 22. In processes carried out by the function control section 21, processes related to sound output such as causing the sound output section 16 to output a sound are carried out by the output-sound control section 22. Various other function blocks (call, mail and the like) of the function control section 21 than the sound output are not illustrated herein because the other function blocks are not related to the features of the present invention.

The output-sound control section 22 (i) determines volume and a frequency of a sound which is to be outputted, (ii) works out a sound wave (waveform) in accordance with the decided volume and frequency, and (iii) outputs an electric signal indicative of the worked-out sound wave into the sound output section 16. The output-sound control section 22 reads out a predetermined value stored in the storage section 12, for example, when the portable phone 1 receives a call and determines the volume and the frequency of a ringtone in accordance with the read-out predetermined value.

Furthermore, the output-sound control section 22 outputs to the feedback-volume estimating section 24 a determined output-volume value indicative of the determined volume of the sound to be outputted. Alternatively, the output-sound control section 22 may be configured to output to the input-volume measuring section 23 an output-sound frequency indicative of the determined frequency of the sound to be outputted.

The input-volume measuring section 23 is a section for receiving the electric signal converted by the sound input section 17 and measuring volume of the sound collected by the sound input section 17. The input-volume measuring section 23 outputs to the volume determination section 26 an input-volume value indicative of measured volume (input volume). Alternatively, the input-volume measuring section 23 may be configured to output the input-volume value indicative of the measured volume to the state determination section 25, or may be configured such that, the input-volume measuring section 23 receives the output-sound frequency from the output-sound control section 22, and measures an amount of a sound (volume) of the frequency component indicated by the output-sound frequency, among the sounds collected by the sound input section 17.

The feedback-volume estimating section 24 receives the determined output-volume value from the output-sound control section 22. The feedback-volume estimating section 24 is a section for estimating, in accordance with the determined output-volume value, volume (feedback volume) of a sound which is supposed to be outputted from the sound output section 16 and to be collected by the sound input section 17 (feedback sound) in a reference state of the sound output section 16 and the sound input section 17. The feedback volume estimated by the feedback-volume estimating section 24 is referred to as estimated volume. The feedback-volume estimating section 24 outputs an estimated-volume value indicative of the estimated volume to the volume determination section 26, or it can also output the estimated volume value indicative of the estimated volume to the state determination section 25.

"A reference state of the sound output section 16 and the sound input section 17" described above means a state in which no object blocking a sound which is outputted from the sound output section 16 and collected by the sound input section 17 is present in a predetermined range from location of the sound output section 16 or the sound input section 17. Furthermore, "object" described above is an object etc. which (i) covers the sound output section 16, (ii) covers the sound input section 17, or (iii) is provided between the sound output section 16 and the sound input section 17.

On the other hand, "a sound which is supposed to be outputted from the sound output section 16 and to be collected by the sound input section 17" described above means a sound outputted from the sound output section 16 and returns to the sound input section 17, thereby being collected by the sound input section 17 after having propagated in the air outside a housing of the portable phone 1. In general, an electronic device including the sound output section 16 and the sound input section 17 is configured such that a sound outputted from the sound output section 16 will not propagate through a housing of the electronic device or a member in the housing so as to prevent the sound from being inputted into the sound input section 17 via such propagation through the housing etc.

Note, here, that volume of a sound outputted from the sound output section 16 and collected by the sound input section 17 in an ideal state in which there is only the portable phone 1 in the air (state in which there is no object other than the portable phone 1) is referred to as ideal feedback volume.

"Predetermined range" described earlier indicates a range between (i) the sound output section 16 or the sound input section 17 and (ii) the object. Note, here, that even in a case where there is the object in the vicinity of the sound output section 16 or the sound input section 17 outside the "predetermined range", volume of a sound outputted from the sound output section 16 and collected by the sound input section 17 is considered to have substantially no difference from the ideal feedback volume.

"Substantially no difference" described above means that the difference is extremely smaller compared with a difference between (i) input volume which is measured when the sound output section 16 and/or the sound input section 17 are/is covered with an object(s) and (ii) the ideal feedback volume.

The input-volume measuring section 23 measures feedback volume of a feedback sound which returns to the sound input section 17 thereby being collected by the sound input section 17 after a predetermined volume of a sound has been outputted from the sound output section 16 in the reference state of the sound output section 16 and the sound input section 17 in advance so that the feedback-volume estimating section 24 can estimate the feedback volume. In accordance with a result of measurement of the feedback volume, a formula, or a table etc. is prepared in advance. The formula is for calculating the estimated-volume value from the determined output-volume value and the table etc. is for associating the determined output-volume values with the estimated-volume values. This makes it possible for the feedback-volume estimating section 24 to deduce the estimated volume from the received determined output-volume value with use of the formula or the table etc. prepared in advance.

Note, that if the formula or the table etc. is prepared, it is preferable to carry out the measurement of the feedback volume of the feedback sound in the reference state of the sound output section 16 and the sound input section 17, and the portable phone 1 is held in stillness in the air and there is no other sound source in the vicinity of the portable phone 1 so that the estimated volume can be estimated accurately.

The state determination section 25 is configured to determine whether or not the sound output section 16 and the sound input section 17 are in the reference state. In other words, the state determination section 25 determines whether or not the volume determination section 26 is in a state in which the state determination section 26 can carry out normal determination. The state determination section 25 notifies a state determination result to the volume determination section 26 if the state determination section 25 determines that the sound output section 16 and the sound input section 17 are in the reference state. Furthermore, the state determination section 25 notifies a state determination result to the function control section 21 (i) if the state determination section 25 determines that the sound output section 16 and the sound input section 17 are in the reference state, and (ii) if the state determination section 25 determines that the sound output section 16 and the sound input section 17 are not in the reference state.

Specifically, the state determination section 25 determines whether or not the input volume measured by the input-volume measuring section 23 is equal to the estimated volume estimated by the feedback-volume estimating section 24. The state determination section 25 determines that (i) the sound output section 16 and the sound input section 17 are in the reference state if the input volume is equal to the estimated volume, and (ii) the sound output section 16 and the sound input section 17 are not in the reference state if the input volume is not equal to the estimated volume.

Note, here, that the state determination section 25 may determine that the sound output section 16 and the sound input section 17 are in the reference state even though the input volume is not exactly equal to the estimated volume provided that a difference between the input volume and the estimated volume is in a predetermined range. For example, in a case where the sound input section 17 picks up a noise, the input volume is not exactly equal to the estimated volume. In this case, determining that the sound output section 16 and the sound input section 17 are in the reference state without taking into account the noise does not cause a problem provided that the noise is low with respect to the input volume.

Accordingly, the state determination section 25 determines that the sound output section 16 and the sound input section 17 are in the reference state, even though the input volume is not exactly equal to the estimated volume, provided that the difference between the input volume and the estimated volume is in the predetermined range. The predetermined range can be any range provided that it allows for such as the noise and a measurement error of the input-volume measuring section 23.

The state determination section 25 determines whether or not a predetermined time has passed since the switch functions started or the output-sound control section 22 caused the sound output section 16 to output a sound. The state determination section 25 determines that the sound output section 16 and the sound input section 17 are in the reference state if the predetermined time has passed, on the other hand, the state determination section 25 determines that the sound output section 16 and the sound input section 17 are not in the reference state if the predetermined time has not passed.

In other words, the state determination section 25 determines whether or not the portable phone 1 is in a state in which the portable phone 1 can carry out normal switch functions.

If the function control section 21 receives, from the state determination section 25, a state determination result indicating that the sound output section 16 and the sound input section 17 are not in the reference state, the function control section 21 carries out a predetermined operation (second process) in accordance with (i) a process being carried out by the function control section 21, and (ii) the state determination result. For example, the function control section 21 may be configured to cause the output-sound control section 22 to raise volume of a ringtone if, during an incoming call process, the function control section 21 receives a state determination result which indicates that the sound output section 16 and the sound input section 17 are in the reference state. Alternatively, the function control section 21 may be configured such that if, during an incoming call process, the function control section 21 receives a state determination result which indicates that the sound output section 16 and the sound input section 17 are not in the reference state, the function control section 21 activates vibration that has been set not to work at receiving a call. Alternatively, the function control section 21 may be configured such that if, during a process for an application of a game etc., the function control section 21 receives a state determination result which indicates that the sound output section 16 and the sound input section 17 are not in the reference state, the function control section 21 notifies to a user that the switch function(s) with use of the sound output section 16 and/or sound input section 17 do(es) not work normally by causing the display section 13 to display a notice (error notice).

The function control section 21 returns a state into a state before the state determination section 25 had carried out the state determination process, if the function control section 21 receives from the state determination section 25 a state determination result which indicates that the sound output section 16 and the sound input section 17 are in the reference state. Specifically, the function control section 21 causes the output-sound control section 22 to raise volume of the ringtone if the function control section 21 receives a state determination result indicative of not being in the reference state from the state determination section 25. On the other hand, the function control section 21 causes the output-sound control section 22 to lower the volume of the ringtone to the determined output-volume value when the function control section 21 receives thereafter a state determination result indicative of being in the reference state. Furthermore, the function control section 21 stops the vibration if the function control section 21 receives a state determination result indicative of being in the reference state after the function control section 21 started the vibrations when the function control section 21 receives a state determination result indicative of not being in the reference state from the state determination section 25. Moreover, the function control section 21 stops displaying the error notice on the display section 13 if the function control section 21 receives the state determination result indicative of being in the reference state after the function control section 21 displayed the error notice when the function control section 21 receives a state determination result indicative of not being in the reference state from the state determination section 25.

The volume determination section 26 is a section for determining whether or not the input volume measured by the input-volume measurement section 23 is lower than the estimated volume estimated by the feedback-volume estimating section 24. The volume determination section 26 notifies a volume determination result to the function control section 21.

Furthermore, the volume determination section 26 determines whether or not the input volume is lower than the estimated volume only if the state determination result indicates that the sound output section 16 and the sound input section 17 are in the reference state in a case where the state determination result is notified by the state determination section 25.

The volume determination section 26 may be configured to determine whether or not the input volume measured by the input-volume measuring section 23 is lower by a predetermined value or more, in comparison with the estimated volume estimated by the feedback-volume estimating section 24. There may be such a case that a user was about to cover the sound output section 16 or the sound input section 17, but the user stops to cover the sound output section 16 or the sound input section 17. Accordingly, it is preferable not to start the switch functions in a case where, for example, a user unintentionally (or temporarily) becomes an object in a predetermined range defined by the position of the sound output section 16 or the sound input section 17. That is, the volume determination section 26 determines whether or not the input volume is lower than the estimated volume by the predetermined value or more. This reduces a malfunction of the switch functions, which is caused when the sound output section 16 or the sound input section 17 is temporarily (unintentionally) covered. In such a case, it is possible to prevent the switch functions from malfunctioning even in a case where the input volume is temporarily lower than the estimated volume because of a measurement error etc.

The function control section 21 receives the volume determination result from the volume determination section 26 while the switch functions are activated. The function control section 21 carries out a predetermined operation (first process) in accordance with (i) a process being carried out by the function control section 21, and (ii) the volume determination result if the function control section 21 receives a volume determination result which indicates that the input volume is lower than the estimated volume. For example, the function control section 21 may cause the output-sound control section 22 to lower the volume of a ringtone if, during the incoming call process, the function control section 21 receives a volume determination result which indicates that the input volume is lower than the estimated volume. Alternatively, the function control section 21 may cause the output-sound control section 22 to stop outputting the ringtone and shift from the incoming call process to an answering machine process if, during the incoming call process, the function control section 21 receives a volume determination result which indicates that the input volume is lower than the estimated volume. The function control section 21 does not carry out the predetermined operation in accordance with the volume determination result, if the function control section 21 receives a volume determination result which indicates that the input volume is not lower than the estimated volume.

The storage section 12 stores a program and data etc. to which the control section 11 refers. The storage section 12 stores a switch-function operation table which defines an operation carried out in accordance with, for example (i) a process being carried out by the function control section 21, and (ii) the volume determination result. In addition, the storage section 12 stores an abnormal-state operation table which defines an operation carried out in accordance with, for example, (i) the process being carried out by the function control section 21, and (ii) the state determination result.

The switch-function operation table and the abnormal-state operation table stored in the storage section 12 is described below with reference to FIG. 3 and FIG. 4, respectively. FIG. 3 is a view showing an example of the switch-function operation table stored in the storage section 12. FIG. 4 is a view showing an example of the abnormal-state operation table stored in the storage section 12.

As shown in FIG. 3, in the switch-function operation table, processes carried by the function control section 21 while causing the switch functions to work are associated with the first processes which are to be carried out by the function control section 21 if the volume determination section 26 determines that the input volume is lower than the estimated volume. If the function control section 21 receives a volume determination result which indicates that the input volume is lower than the estimated volume from the volume determination section 26, the function control section 21 reads out the switch-function operation table from the storage section 12 so as to carry out a process that the switch-function operation table associates with the process being carried out. For example, in the example shown in FIG. 3, the function control section 21 instructs the output-sound control section 22 to lower volume of a sound outputted from the sound output section 16, if, during the incoming call process, the function control section 21 receives a volume determination result which indicates the input volume is lower than the estimated volume from the volume determination section 26.

On the other hand, as shown in FIG. 4, in the abnormal-state operation table, a process being carried by the function control section 21 while causing the switch functions to work is associated with the second processes which are to be carried out by the function control section 21 if the state determination section 25 determines that the sound output section 16 and the sound input section 17 are not in the reference state. If the function control section 21 receives a state determination result which indicates that the sound output section 16 and the sound input section 17 are not in the reference state from the state determination section 25, the function control section 21 reads out the abnormal-state operation table from the storage section 12 so as to carry out a process that the abnormal-state operation table associates with the process being carried out. For example, in the example shown in FIG. 4, the function control section 21 instructs the output-sound control section 22 to raise volume of a sound outputted from the sound output section 16 if, during the incoming call process, the function control section 21 receives a state determination result which indicates that the sound output section 16 and the sound input section 17 are not in the reference state from the state determination section 25.

[State of Portable Phone]

Figure 5:
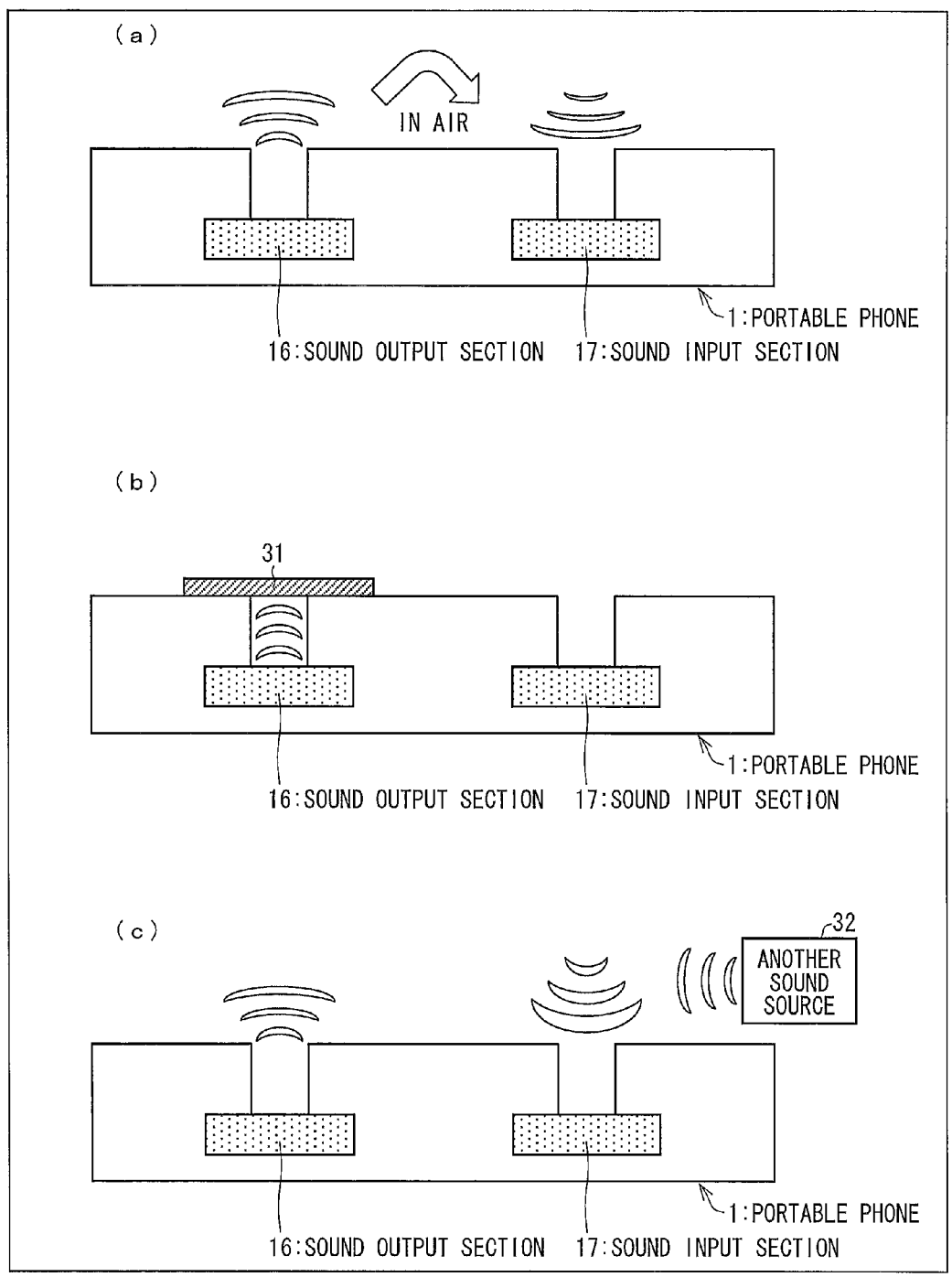
FIG. 5 is a view schematically showing various states of the portable phone. (a) of FIG. 5 shows a reference state of a sound output section and a sound input section of the portable phone, (b) of FIG. 5 shows a state in which the sound output section is covered with an object, and (c) of FIG. 5 shows a state in which there is another sound source other than the sound output section in the vicinity of the portable phone.

Next, various states of the portable phone is described below with reference to FIG. 5. FIG. 5 is a view schematically showing various states of the portable phone. (a) of FIG. 5 shows the reference state of the sound output section 16 and the sound input section 17 of the portable phone 1, (b) of FIG. 5 shows a state in which the sound output section 16 is covered with an object 31, and (c) of FIG. 5 shows a state in which another sound source 32 other than the sound output section 16 is present in the vicinity of the portable phone 1. Note that in the present embodiment, examples of the object 31 which covers the sound input section 16 are assumed to be a user's finger or a palm etc.

As shown in (a) of FIG. 5, a sound outputted from the sound output section 16 propagates in the air and returns to the sound input section 17 thereby being collected by the sound input section 17 if the sound output section 16 and the sound input section 17 are in the reference state. In this case, the sound input section 17 collects a sound having volume substantially the same as the estimated volume estimated by the feedback-volume estimating section 24.

As shown in (b) of FIG. 5, in a case where (an opening of) the sound output section 16 is covered with the object 31, a sound outputted from the sound output section 16 does not propagate in the air, so that the sound outputted from the sound output section 16 is not collected by the sound input section 17. In such a case, the sound input section 17 collects a sound having volume lower than the estimated volume estimated by the feedback-volume estimating section 24.

Accordingly, the portable phone 1 can detect whether or not the sound output section 16 is covered with an object (object 31) in accordance with determination indicative of whether or not volume of a sound inputted into the sound input section 17 is lower than the estimated volume while the sound is being outputted from the sound output section 16.

As described earlier, the function control section 21 carries out the predetermined operation if the function control section 21 receives a volume determination result which indicates that the input volume is lower than the estimated volume. This makes it possible for a user to cause the portable phone 1 to carry out the predetermined operation by covering the sound output section 16 with the user's finger etc. In other words, it is possible to allow the sound output section 16 to have a function of an operation section.

Needless to say, again in a case where (an opening of) the sound input section 17 is covered instead of covering (the opening of) the sound output section 16, the sound collected by the sound input section 17 will be one having volume lower than the estimated volume estimated by the feedback-volume estimating section 24. This makes it possible for the portable phone 1 to decide at least one (of the openings) of the sound output section 16 and the sound input section 17 is covered with an object, if the input volume is lower than the estimated volume.

On the other hand, as shown in (c) of FIG. 5, in a case where another sound source 32 is present in the vicinity of the portable phone 1, the sound input section 17 collects another sound outputted by another sound source 32, as well as the sound that is outputted from the sound output section 16 and propagates in the air. As a result, the sound input section 17 collects sounds having volume higher than the estimated volume estimated by the feedback-volume estimating section 24.

Note, however, that even in a case where the sound output section 16 or the sound input section 17 is covered with an object, in some cases, the sound input section 17 collects a sound having volume not lower than the estimated volume estimated by the feedback-volume estimating section 24. In other words, in such a case, even though the sound output section 16 or the sound input section 17 is covered, the sound input section 17 collects sounds having volume higher than the estimated volume because the sound input section 17 also collects a sound outputted from another sound source 32.

Accordingly, in a case where another sound source 32 is present in the vicinity of the portable phone 1 as shown in (c) of FIG. 5, in some cases, the portable phone 1 is unable to decide accurately whether or not at least one of the sound output section 16 and the sound input section 17 is covered with an object.

In addition, for example if the user has unintentionally covered the sound output section 16 or the sound input section 17 when the portable phone 1 caused the switch functions of the sound output section 16 and the sound input section 17 to work, the portable phone 1 would possibly carry out the predetermined operation even though a user has not intended to.

Note, however, as described earlier, the state determination section 25 determines whether or not the input volume is equal to the estimated volume before the volume determination section 26 carries out the determination, thereby enabling the portable phone 1 to decide whether or not the portable phone 1 is in a state shown in (a) of FIG. 5. Therefore, it is possible to accurately cause the switch functions of the sound output section 16 and the sound input section 17 of the portable phone 1 to work by allowing the volume determination section 26 to determine whether or not the input volume is lower than the estimated volume after the portable phone 1 has decided that the portable phone 1 is in the state shown in (a) of FIG. 5.

[Switch Function Processes of Sound Output Section and Sound Input Section]

Figure 6:
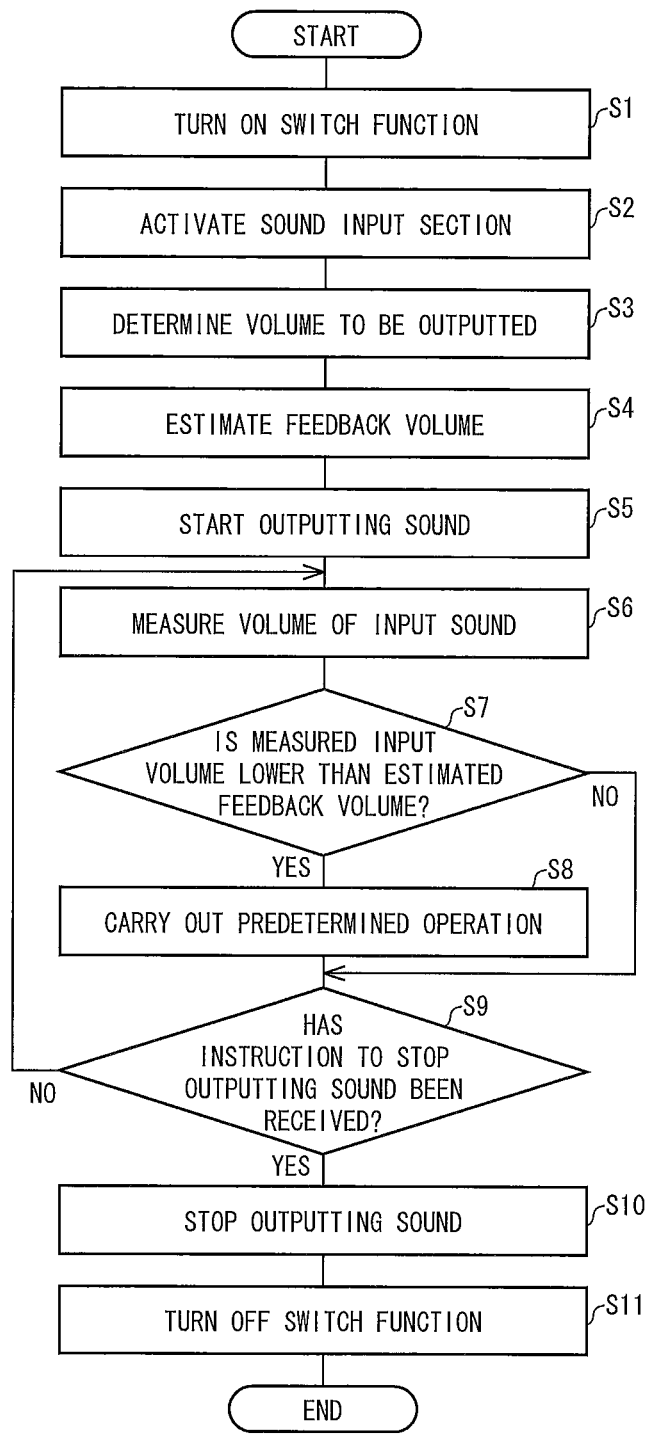
FIG. 6 is a flowchart showing an example of switch function processes performed by the sound output section and the sound input section included in the portable phone.
Figure 7:
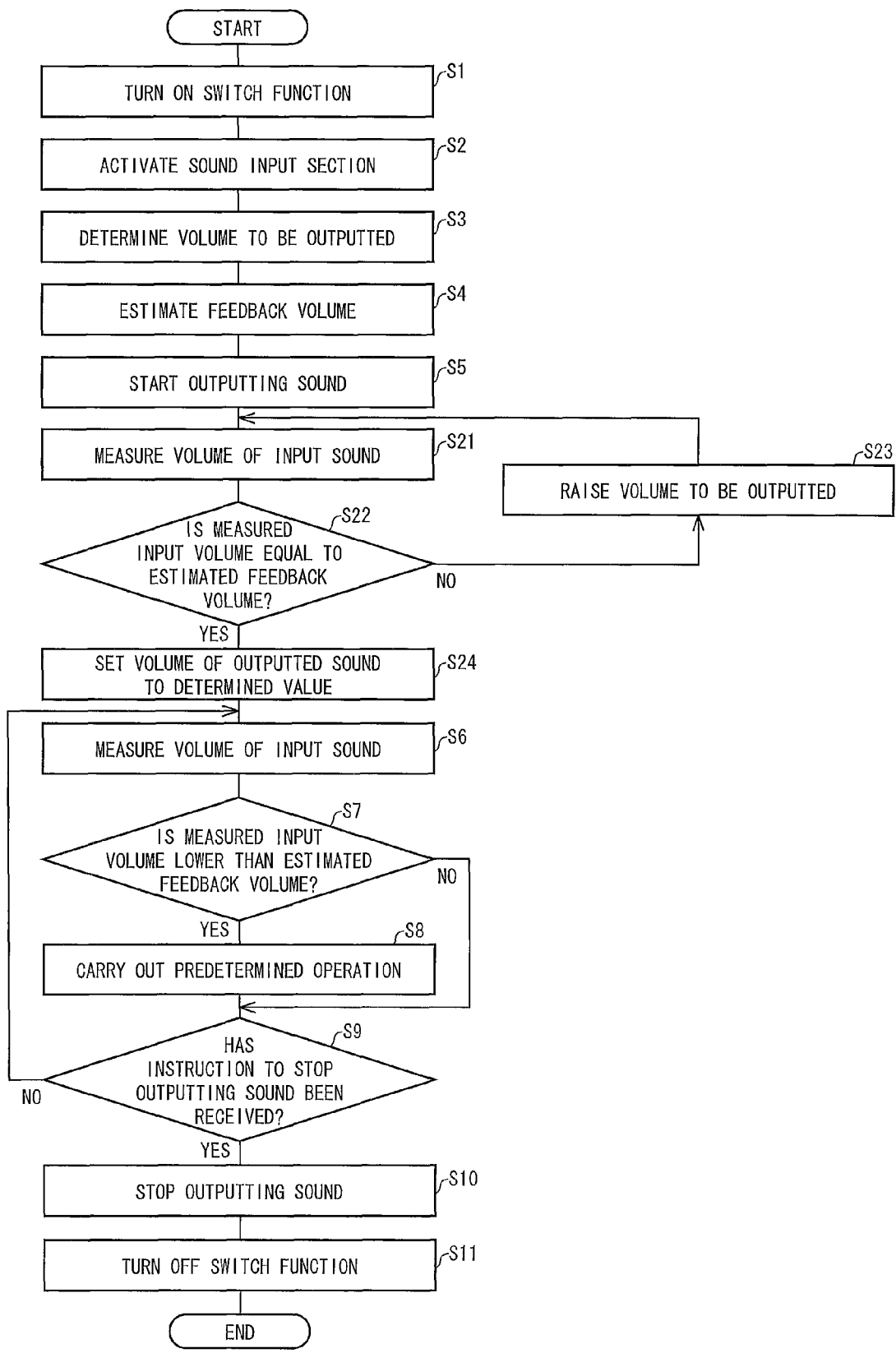
FIG. 7 is a flowchart showing an example of the switch function processes performed by the sound output section and the sound input section included in the portable phone.
Figure 8:
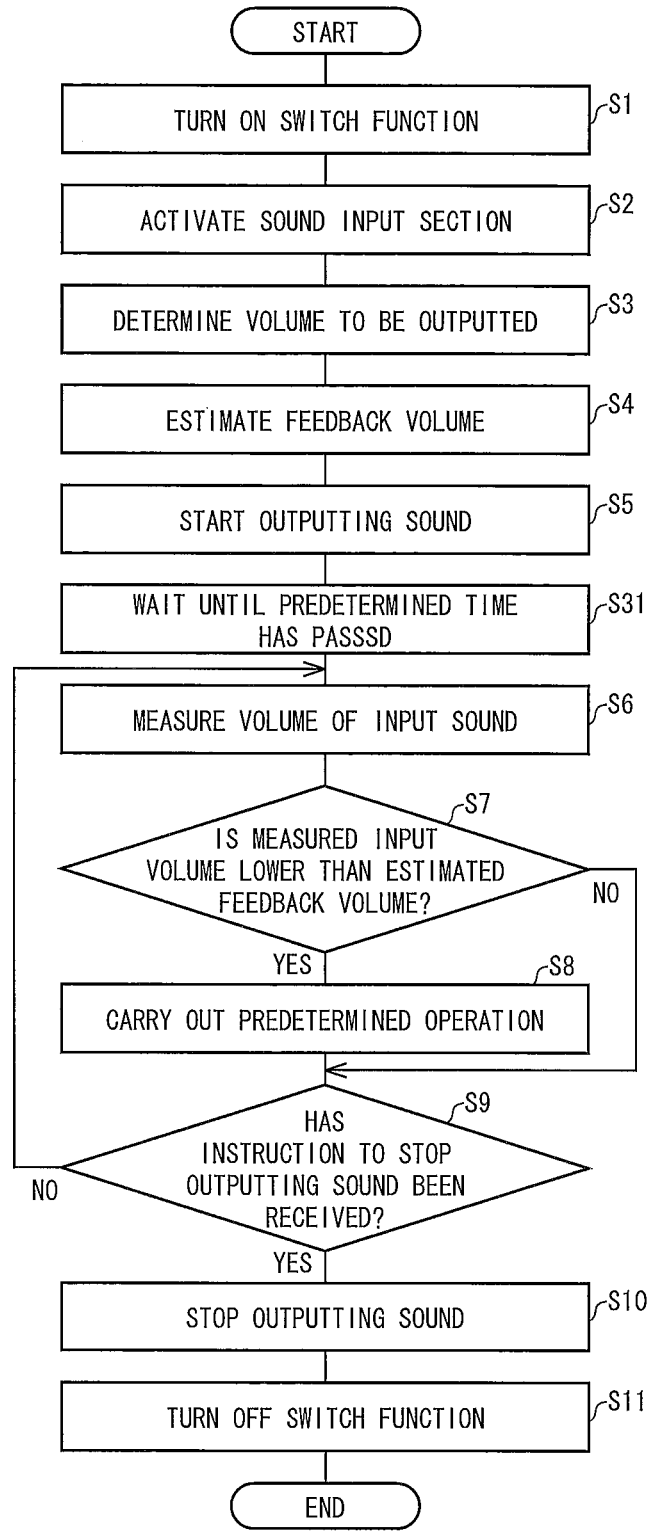
FIG. 8 is a flowchart showing an example of the switch function processes performed by the sound output section and the sound input section included in the portable phone.

Next, each switch function processes of the sound output section 16 and sound input section 17 included in the portable phone 1 is described below with reference to FIG. 6 to FIG. 8. FIG. 6 to FIG. 8 are flowcharts each showing an example of the switch function processes of the sound output section 16 and the sound input section 17 of the portable phone 1.

Example 1 of Switch Function Processes

First, a basic example of the switch function processes of the sound output section 16 and the sound input section 17 of the portable phone 1 is described with reference to FIG. 6.

As shown in FIG. 6, the function control section 21 turns on the switch functions of the sound output section 16 and the sound input section 17 (S1). The function control section 21 causes the sound input section 17 to work (S2) after activating the switch functions. The output-sound control section 22 determines volume of a sound which is to be outputted from the sound output section 16 (S3) after the function control section 21 has activated the switch functions.

The feedback-volume estimating section 24 receives a determined output-volume value and estimates, in accordance with the determined output-volume value, estimated volume of a sound which is supposed to be outputted from the sound output section 16 and inputted into the sound input section 17 (S4). Then, the output-sound control section 22 works out a sound wave (wave form) in accordance with the decided volume and outputs the sound wave to the sound output section 16 as an electric signal in order to cause the sound output section 16 to output a sound with the sound wave (S5).

Next, the input-volume measuring section 23 receives an electric signal converted by the sound input section 17 and measures volume of a sound which has been collected by the sound input section 17 (S6). The volume determination section 26 receives (i) input volume from the input-volume measuring section 23 and (ii) the estimated volume from the feedback-volume estimating section 24, and determines whether or not the input volume is lower than the estimated volume (S7). The volume determination section 26 sends to the function control section 21 a volume determination result which indicates whether or not the input volume is lower than the estimated volume.

If the function control section 21 receives a volume determination result which indicates that the input volume is lower than the estimated volume (YES in S7), the function control section 21 reads out the switch-function operation table from the storage section 12, so as to refer to the switch-function operation table to determine which operation to carry out, and carries out the operation thus determined (S8). On the other hand, the function control section 21 does not carry out the process in accordance with the volume determination result, if the function control section 21 receives a volume determination result which indicates that the input volume is not lower than the estimated volume (NO in S7), and the process goes to S9.

The output-sound control section 22 determines whether or not it has received a stop instruction for causing the sound output section 16 to stop outputting a sound (S9). If the output-sound control section 22 does not receive the stop instruction for causing the sound output section 16 to stop outputting a sound (NO in S9), the process goes back to S6 and then the input-volume measuring section 23 again receives an electric signal converted by the sound input section 17 so as to measure volume of a sound which has been collected by the sound input section 17 (S6).

On the other hand, if the output-sound control section 22 receives the stop instruction for causing the sound output section 16 to stop outputting a sound (YES in S9), the output-sound control section 22 causes the sound output section 16 to stop outputting a sound (S10). Then, the function control section 21 (i) causes the sound input section 17 to stop working and (ii) inactivates the switch functions (S11).

Example 2 of Switch Function Processes

Next, one example of switch function processes which carry out a volume determination after the portable phone 1 has confirmed that the portable phone 1 is in the reference state is described with reference to FIG. 7. The example of the switch function processes shown in FIG. 7 includes a process which determines a state of the portable phone 1 between S5 and S6, whereby this example is different from the example of the switch function processes shown in FIG. 6. In the following descriptions, processes which are different from the example of the switch function processes shown in FIG. 6 in the example of the switch function processes shown in FIG. 7 are mainly described.

In the example of the switch function processes shown in FIG. 7, the function control section 21 activates the switch functions when the portable phone 1 receives a call. The volume determination section 26 carries out a volume determination process after the state determination section 25 has confirmed that the sound output section 16 and the sound input section 17 are in the reference state.

Specifically, as shown in FIG. 7, processes of S1 through S5 are carried out as in the example of the switch function processes shown in FIG. 6. After the process of S5, the input-volume measuring section 23 receives an electric signal converted by the sound input section 17 so as to measure volume of a sound which has been collected by the sound input section 17 (S21).

Next, the state determination section 25 determines whether or not the input volume measured by the input-volume measuring section 23 is equal to the estimated volume estimated by the feedback-volume estimating section 24 (S22). If the state determination section 25 determines that the input volume is not equal to the estimated volume (NO in S22), the output-sound control section 22 of the function control section 21 causes the sound output section 16 to raise volume of a sound (S23). Specifically, the output-sound control section 22 causes the sound output section 16 to output a sound having volume higher than the volume decided in S3 (determined output-volume value).

On the other hand, the state determination section 25 notifies a determination result to the volume determination section 26 if the state determination section 25 determines that the input volume is equal to the estimated volume (i.e., reference state) (YES in S22). In addition, at the same time, the output-sound control section 22 of the function control section 21 causes the sound output section 16 to output a sound having volume of the determined output-volume value (i.e., the volume value decided in S3) (S24).

Next, processes of S6 through S11 are carried out as in the example of the switch function processes shown in FIG. 6.

As described above, the volume determination section 26 carries out the volume determination process after the state determination section 25 has confirmed that the sound output section 16 and the sound input section 17 is in the reference state. This makes it possible to prevent a malfunction which is caused because, for example, a user unintentionally covers the sound output section 16 or the sound input section 17 when the switch functions are activated.

An example of such a case in which the sound output section 16 and the sound input section 17 are not in the reference state when the switch functions are caused to start includes a state in which a user does not know that a ringtone of the portable phone 1 is ringing because the portable phone 1 has been in a bag or a pocket etc. when the portable phone 1 receives a call. In such a case, the output-sound control section 22 causes the sound output section 16 to raise a sound in S23. This makes it possible not only to prevent the switch functions from malfunctioning but also to notify a call to a user more certainly.

If the volume of a ringtone was raised in order to more certainly notify a user, it is preferable to restore the volume of the ringtone to volume predetermined by the user once the sound output section 16 and the sound input section 17 regain the reference state. Then in S24, the output-sound control section 22 causes the sound output section 16 to output a sound having volume of the determined output-volume value after the state determination section 25 has determined that the sound output section 16 and the sound input section 17 regain the reference state.

It may be arranged such that if the output-sound control section 22 has not received a stop instruction for causing the sound output section 16 to output a sound in S9 (No in S9), the process goes back to S21 instead of going back to S6. This makes it possible for the volume determination section 26 to carry out the volume determination process only when the portable phone 1 is in the reference state.

Example 3 of Switch Function Processes

Next, an another example of the switch function processes, which carries out the volume determination after the portable phone 1 has confirmed that it is in the reference state is described with reference to FIG. 8. FIG. 8 shows the example of the processes in which the portable phone 1 confirms that it is in the reference state after a predetermined time has passed since the switch functions were activated.

As shown in FIG. 8, the example of the switch function processes shown in FIG. 8 includes a process for waiting until a predetermined time has passed between S5 and S6, which is different from the example of the switch function processes shown in FIG. 6. Specifically, the state determination section 25 determines whether or not the predetermined time has passed (S31) since the output-sound control section 22 caused the sound output section 16 to output a sound (S5). The input-volume measuring section 23 measures volume of a sound collected by the sound input section 17 (S6) if the state determination section 25 has determined that the predetermined time has passed.

Note here that the processes of S1 through S5 shown in FIG. 8 are the same as the processes of S1 through S5 shown in FIG. 6, and the processes of S6 through S11 shown in FIG. 8 are the same as the processes of S6 through S11 shown in FIG. 6.

[Modification]

In the embodiment 1, whether the sound output section 16 or the sound input section 17 is covered by a user is judged in accordance with the determination made by the volume determination section 26 which determines whether or not the input volume is lower than the estimated volume. Note, however, that the judgment is not necessarily made in accordance with the determination.

For example, the volume determination section 26 may determine whether or not a wave form of an input sound measured by the input-volume measuring section 23 (change of input volume over a period of time) is equal to a wave form of a feedback sound in a blocked state in which the sound output section 16 or the sound input section 17 is covered with an object. In such a case, the function control section 21 carries out the first process if the volume determination section 26 determines that the wave form of the input sound measured by the input-volume measuring section 23 is equal to the wave form of the feedback sound in a state in which the sound output section 16 or the sound input section 17 is covered with an object.

In other words, the volume determination section 26 determines whether or not the wave form of the input sound measured by the input-volume measuring section 23 is equal to the wave form of the feedback sound in the blocked state in which the sound output section 16 or the sound input section 17 is covered with an object. According to the determination, whether the sound output section 16 or the sound input section 17 is covered by a user can be judged. Note here that, in such a case, it is judged that the sound output section 16 or the sound input section 17 is covered by a user if the two wave forms are equal to each other.

In such a case, the wave form of the feedback sound (change of feedback sound over a period of time) is measured in advance in the blocked state in which the sound output section 16 or the sound input section 17 is covered with an object. The feedback sound is a sound which is outputted from the sound output section 16 with a predetermined volume and is collected by the sound input section 17 upon returning to the sound input section 17. Then, a wave form of the feedback sound in the state in which the wave form of the feedback sound in the state in which the sound output section 16 or the sound input section 17 is covered with an object (blocked state wave form) is determined in accordance with a measurement result of the feedback sound, and the blocked state wave form is stored in the storage section 12.

The volume determination section 26 reads out the blocked state wave form from the storage section 12 so as to determine whether or not a wave form of an input sound measured by the input-volume measuring section 23 is equal to the blocked state wave form.

Alternatively, an output blocked state wave form which is a wave form of the feedback sound in an output blocked state in which the sound output section 16 is blocked with an object may be stored in the storage section 12 in advance. The feedback sound is a sound which is outputted from the sound output section 16 with a predetermined volume and is collected by the sound input section 17 upon returning to the sound input section 17. Alternatively, an input blocked state wave form which is a wave form of the feedback sound in an input blocked state in which the sound input section 17 is blocked with an object may be stored in the storage section 12 in advance. The feedback sound is a sound which has been outputted from the sound output section 16 with a predetermined volume and is collected by the sound input section 17 upon returning to the sound input section 17. Alternatively, an input-output blocked state wave form of a wave form of the feedback sound in an input-output blocked state in which each of the sound output section 16 and the sound input section 17 are blocked with an object may be stored in the storage section 12 in advance. The feedback sound is a sound which is outputted from the sound output section 16 with a predetermined volume and is collected by the sound input section 17 upon returning to the sound input section 17.

In this manner, the output blocked state wave form, the input blocked state wave form and the input-output blocked wave form are stored in the storage section 12. In such case, the volume determination section 26 determines whether the wave form of an input sound measured by the input volume measuring section 23 is equal to any one of the output blocked state wave form, the input blocked state wave form or the input-output blocked wave form. This determination result makes it possible to judge whether or not both of the sound output section 16 and the sound input section 17 are blocked, or whether or not one of the sound output section 16 and the sound input section 17 is blocked.

Furthermore, in the reference state of the sound output section 16 and the sound input section 17, a reference state wave form which is a wave form of a feedback sound can be stored in the storage section 12. The feedback sound is a sound which is outputted from the sound output section 16 with a predetermined volume and is collected by the sound input section 17 upon returning to the sound input section 17.

In a case where the reference state wave form is stored in the storage section 12 as described above, the volume determination section 26 determines whether or not a wave form of the input sound measured by the input-sound measuring section 23 is equal to any one of the blocked state wave form or the reference state waveform. This makes it possible to judge a state whether it is in the blocked state, reference state or another state.

Moreover, for example, a wave form of a feedback sound outputted from the sound output section 16 with a predetermined volume and collected by the sound input section 17 upon returning to the sound input section 17 in a state where the reference state and the blocked state are repeated alternately may be stored in the storage section 12 in advance. This makes it possible to judge whether a user has blocked the sound output section 16 or the sound input section 17 several times at predetermined intervals.

Furthermore, for example, a wave form of a feedback sound outputted from the sound output section 16 with a predetermined volume and is collected by the sound input section 17 upon returning to the sound input section 17 in a state where, for example, the reference state, the output blocked state, the reference state, the input blocked state, and the reference state switched over may be stored in the storage section 12 in advance. This makes it possible to judge whether a user has blocked the sound output section 16 or the sound input section 17 in a predetermined order.

In this manner, a wave form in which each of the states has switched over in a predetermined order or a wave form in which each of the states has switched predetermined times or at predetermined timings is stored in the storage section 12 in advance. This makes it possible to judge (i) an order, (ii) number of times, or (iii) timings in which the sound output section 16 and the sound input section 17 have been blocked.

Embodiment 2

Embodiment 2 of the present invention is described below with reference to FIG. 9 and FIG. 10. In Embodiment 2, the switch function is realized only by the sound input section 17, whereby Embodiment 2 is different from Embodiment 1. Specifically, in Embodiment 2, whether or not the sound input section 17 is covered with a finger etc. is judged in accordance with a change of volume of sounds inputted into the sound input section 17 after the sound input section 17 is activated so as to collect the sounds in the vicinity of the portable phone 1. The following description discusses Embodiment 2 mainly on a point different from Embodiment 1. For the sake of easy explanation, like members having like function as those in Embodiment 1 are assigned with like reference numerals, and their descriptions are omitted here.

[Configuration of Portable Phone]

Figure 9:
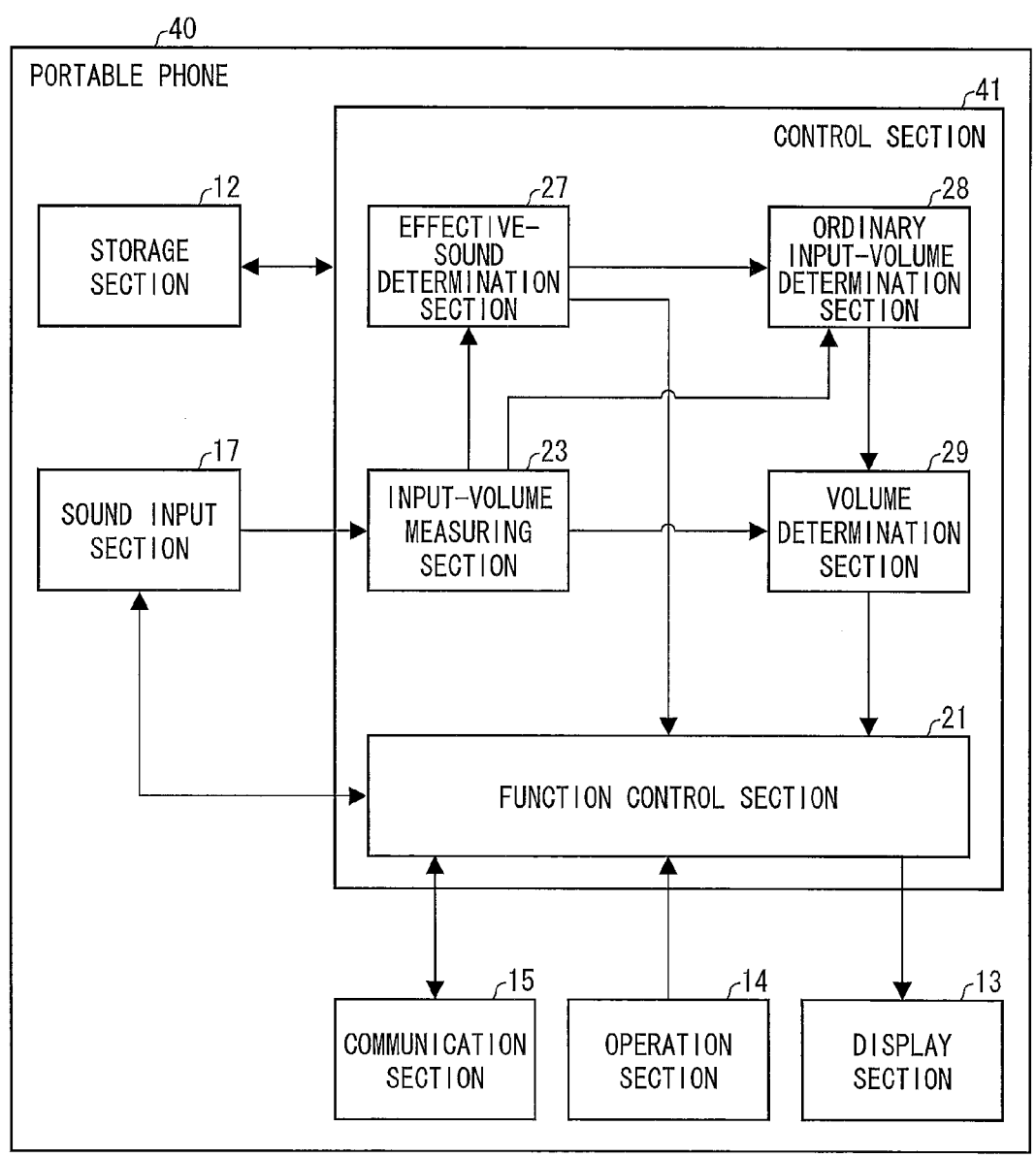
FIG. 9 is a block diagram showing a configuration of main parts of a portable phone in accordance with Embodiment 2 of the present invention.

FIG. 9 is a block diagram showing a configuration of main parts of a portable phone 40. As shown in FIG. 9, the portable phone 40 includes a control section 41, a storage section 12, a display section 13, an operation section 14, a communication section 15 and a sound input section 17. Although the portable phone 40 in accordance with Embodiment 2 may also include a sound output section 16, the sound output section 16 is not shown here since in this embodiment, the switch function is realized by only the sound input section 17 as described above.

The control section 41 (i) carries out various calculations by running programs which are read out from the storage section 12 to a temporary storage section (not shown) and (ii) controls each of the sections included in the portable phone 40 in an integrated manner.

In this embodiment, the control section 41 is configured such that it includes, as function blocks, a function control section 21, an input-volume measuring section 23, an effective-sound determination section 27, an ordinary input-volume determination section 28 and a volume determination section 29. Each of the function blocks (21, 23, 27 to 29) of the control section 41 can be realized when a CPU carries out a program stored in a storage device which is realized by such as ROM by reading out in the temporary storage section which is realized by such as RAM.

Note, that the function control section 21 controls functions included in the portable phone 1, and can include the output-sound control section 22 as Embodiment 1 but the output-sound control section 22 has nothing to do with the feature of the present embodiment, so that it is not shown here.

The input-volume measuring section 23 is a section for receiving an electric signal converted by the sound input section 17 and measuring volume of a sound collected by the sound input section 17, which is the same as Embodiment 1. The input-volume measuring section 23 outputs an input-volume value indicative of measured volume (input volume) to the effective-sound determination section 27, the ordinary input-volume determination section 28 and the volume determination section 29.

The effective-sound determination section 27 determines whether or not the input-volume value indicative of the input volume measured by the input volume measuring section 23 falls within a predetermined effective range. The effective-sound determination section 27 notifies an effective sound determination result to the ordinary input-volume determination section 28, if the effective-sound determination section 27 has determined that the input-volume value has fallen within the predetermined effective range. On the other hand, the effective-sound determination section 27 notifies an effective sound determination result to the function control section 21, if the effective-sound determination section 27 has determined that the input-volume value has not fallen within the predetermined effective range.

What is meant by the effective range is a range defined by a predetermined lower limit and a predetermined upper limit. In other words, the effective-sound determination section 27 determines whether or not the sound input section 17 collects a sound having a predetermined volume. The volume of the sound inputted into the sound input section 17 suddenly decreases while the sound input section 17 is collecting a sound having a certain volume, if the sound input section is covered. This makes it possible to judge whether the sound input section 17 has been covered in accordance with a change of the volume of the sound inputted into the sound input section 17.

Note, however, that while the sound input section 17 is collecting a sound having extremely low volume, the effective-sound determination section 27 cannot determine whether the sound input section 17 has been covered even though the sound input section 17 has actually been covered, because the volume of the sound inputted into the sound input section 17 scarcely changes.

On the other hand, while the sound input section 17 is collecting a sound having extremely high volume, the sound having the same high volume is less likely to keep occurring in the vicinity of the portable phone 40. In such a case in which the volume of the sound collected by the sound input section 17 extremely changes, the effective-sound determination section 27 cannot determine whether or not the change is caused by pressing the sound input section 17. That is, also while the sound input section 17 is collecting the sound having extremely high volume, this situation is not suitable to a state in which the function control section 21 activates the switch function of the sound input section 17.

Accordingly, the effective-sound determination section 27 determines whether or not the input-volume value falls within the predetermined effective range. This makes it possible to judge whether a present state of the portable phone 40 is in a state in which the switch function of the sound input section 17 can precisely work.

The ordinary input-volume determination section 28 is a section for receiving the effective-sound determination result which indicates that the input-volume value fell within the predetermined effective range, and determining an ordinary input-volume value in accordance with the input-volume value measured by the input volume measurement section 23 in a predetermined period including the time at which the input-volume value used by the effective-sound determination section 27 for determination was measured. The ordinary input-volume determination section 28 outputs thus determined ordinary input-volume value to the volume determination section 29.

Note, here, that the ordinary input-volume value is a section for indicating a reference value of the sounds occurring in the vicinity of the portable phone 40 in the predetermined period. The ordinary input-volume determination section 28, for example, (i) may be configured to allow an average value of the input-volume value measured by the input-volume measuring section 23 in the predetermined period to be the ordinary input-volume value, (ii) may be configured to allow a median of the input-volume value measured by the input-volume measuring section 23 in the predetermined period to be the ordinary input-volume value, (iii) may be configured to allow a lower limit of the input-volume value measured by the input volume measuring section 23 in the predetermined period to be the ordinary input-volume value, or (iv) may be configured to allow the lower limit of the predetermined effective range to be the ordinary input-volume value.

The volume determination section 29 is a section for receiving (i) a current input-volume value from the input-volume measuring section 23 and (ii) the ordinary input-volume value from the ordinary input-volume determination section 28, and determining whether or not the current input-volume value is lower than the ordinary input-volume value. The volume determination section 29 notifies a volume determination result to the function control section 21.

Furthermore, the volume determination section 29 can determine whether or not the current input-volume value is lower than the ordinary input-volume value by a predetermined value or more. The current input-volume value is likely to be lower than the ordinary input-volume value even though the sound input section 17 is not blocked because volume of the sounds occurring in the vicinity of the portable phone 40 changes. In such a case, it is preferable for the function control section 21 not to activate the switch function because a user might not have intended to. Accordingly, the volume determination section 29 determines whether or not the current input-volume value is lower than the ordinary input-volume by the predetermined value or more, thereby the number of malfunctions of the switch function can be reduced. This makes it possible to prevent malfunctions of the switch function even in a case where the input volume temporarily has been lower than the ordinary input-volume value because of an error in measurement etc.

If the function control section 21 receives the volume determination result which has indicated that the current input-volume value has been lower than the ordinary input-volume value from the volume determination section 29, and the function control section 21 carries out a predetermined operation in accordance with (i) a process being carried out by the function control section 21, and (ii) the volume determination result.

If the function control section 21 receives the effective-sound determination result which has indicated that the input-volume value has not fallen in the predetermined effective range from the effective-sound determination section 27, the function control section 21 displays a notice which indicates that the input-volume value is not in the effective range on the display section 13.

[Switch Function Processes of Sound Input Section]

Next, the switch function processes of the sound input section 17 in the portable phone 40 is described with reference to FIG. 10. FIG. 10 is a flowchart showing an example of the switch function processes of the sound input section 17 included in the portable phone 40.

Figure 10:
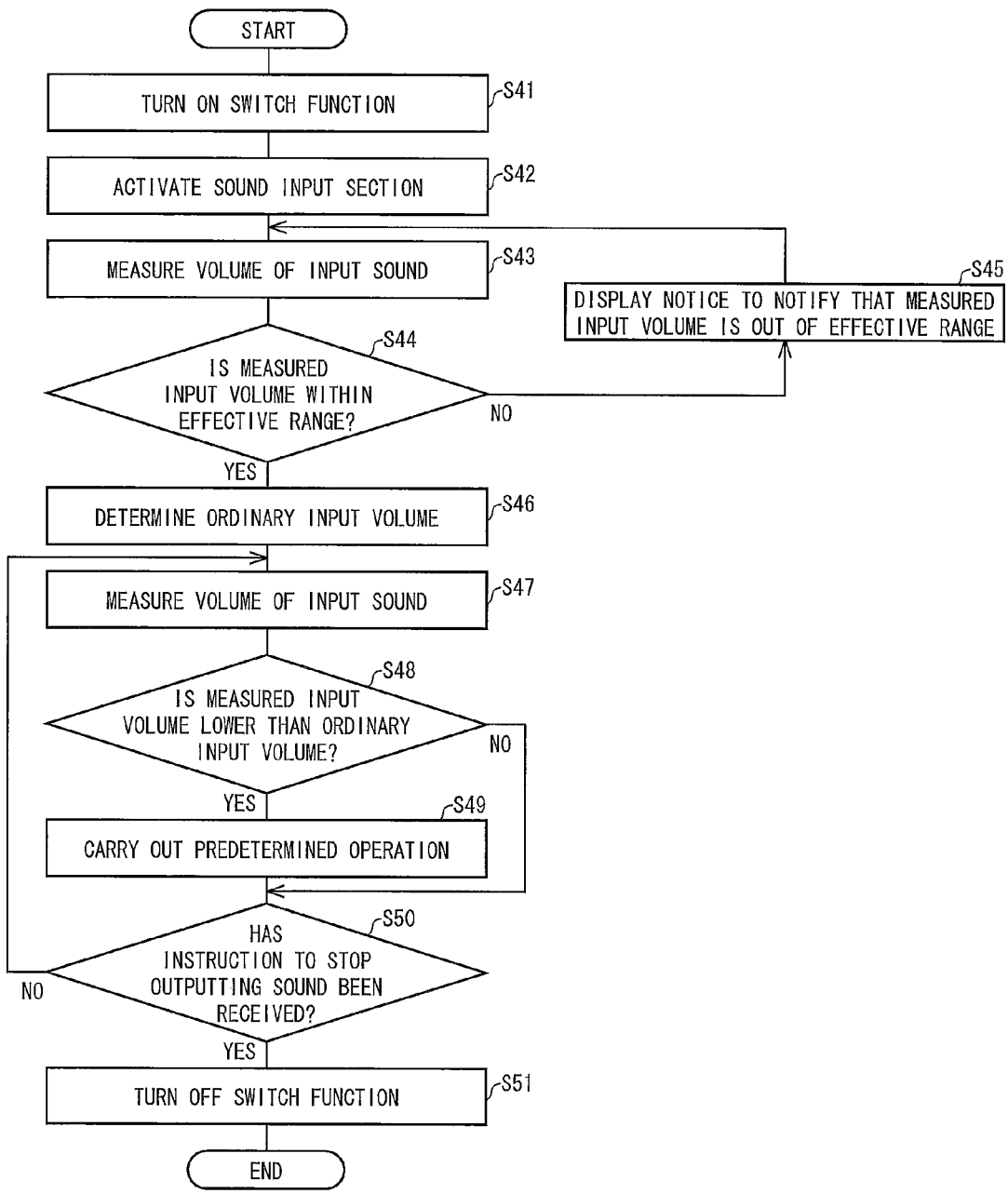
FIG. 10 is a flowchart showing an example of switch function processes performed by the sound input section included in the portable phone.

As shown in FIG. 10, the function control section 21 turns on the switch function of the sound input section 17 (S41). After starting the switch function, the function control section 21 activates the sound input section 17 (S42).

After the sound input section 17 was activated, the input-volume measuring section 23 receives an electric signal converted by the sound input section 17 and measures volume of a sound collected by the sound input section 17 (S43). Then, the effective-sound determination section 27 determines whether or not the input-volume value indicative of the input volume measured by the input-volume measuring section 23 falls within the predetermined effective range (S44).

If the effective-sound determination section 27 determines that the input-volume value has not fallen within the predetermined effective range (NO in S43), the function control section 21 displays the notice which indicates that the input-volume value does not fall within the effective range on the display section 13 (S45). Then the process goes back to S43. On the other hand, if the effective-sound determination section 27 determines that the input-volume value has fallen within the predetermined effective range (YES in S43), the ordinary input-volume determination section 28 determines the ordinary input-volume value in accordance with the input-volume value measured by the input-volume measuring section 23 in the predetermined period including the time at which the input-volume value used by the effective-sound determination section 27 for determination was measured (S46).

After the ordinary input-volume determination section 28 determined the ordinary input-volume value, the input-volume measuring section 23 receives an electric signal converted by the sound input section 17 and measures volume of a sound collected by the sound input section 17 (S47). The volume determination section 29 (i) receives the input-volume value from the input-volume measuring section 23 and the ordinary input-volume value from the ordinary input-volume determination section 28 and (ii) determines whether or not the input-volume value is lower than the ordinary input-volume value (S48).

If the function control section 21 receives the volume determination result which indicates that the input volume value is lower than the ordinary input-volume value (YES in S48), the function control section 21 carries out the predetermined operation (S49). On the other hand, if the function control section 21 receives the volume determination result which indicates that the input-volume value is lower than the ordinary input-volume value (NO in S48), the function control section 21 does not carry out a process in accordance with the volume determination result, and the process goes to S50.

Then, the function control section 21 determines whether or not it has received an instruction to inactivate the switch function (S50). If the function control section 21 has not received the instruction to inactivate the switch function (NO in S50), the process goes back to S47, and the input-volume measuring section 23 receives an electric signal converted by the sound input section 17 again and measures volume of a sound collected by the sound input section 17.

On the other hand, if the function control section 21 has received an instruction to inactivate the switch function (YES in S50), the function control section 21 inactivates the sound input section 17 and the switch function (S51).

Note, that if the function control section 21 has not received the instruction to inactivate the switch function in S50 (NO in S50), the process can go back to S43, instead of going back to S47. This makes it possible for the volume determination section 29 to carry out its operation only when the sound collected by the sound input section 17 falls within the effective range.

<Remarks>

The present invention is not limited to the description of the embodiments above, but may be altered by a skilled person within the scope of the claims. An embodiment based on a proper combination of technical means disclosed in different embodiments is encompassed in the technical scope of the present invention.

Finally, each of the blocks of the portable phones 1 and 40, especially the control sections 11 and 41 may be realized by way of hardware or software as executed by a CPU as follows.

The portable phones 1, 40 each include a CPU and memory devices. The CPU executes instructions in control programs realizing the functions. The memory devices include a ROM which contains programs, a RAM to which the programs are loaded, and a memory containing the programs and various data. The objective of the present invention can also be achieved by mounting to the portable phones 1, 40 a computer-readable storage medium containing control program code (executable program, intermediate code program, or source program) for the portable phones 1, 40, which is software realizing the aforementioned functions, in order for the computer (or CPU, MPU) to retrieve and execute the program code contained in the storage medium.

The storage medium may be, for example, a tape, such as a magnetic tape or a cassette tape; a magnetic disk, such as a floppy (Registered Trademark) disk or a hard disk, or an optical disk, such as CD-ROM/MO/MD/DVD/CD-R; a card, such as an IC card (memory card) or an optical card; or a semiconductor memory, such as a mask ROM/EPROM/EEPROM/flash ROM.

The portable phones 1, 40 may be arranged to be connectable to a communications network so that the program code may be delivered over the communications network. The communications network is not limited in any particular manner, and may be, for example, the Internet, an intranet, extranet, LAN, ISDN, VAN, CATV communications network, virtual dedicated network (virtual private network), telephone line network, mobile communications network, or satellite communications network. The transfer medium which makes up the communications network is not limited in any particular manner, and may be, for example, wired line, such as IEEE 1394, USB, electric power line, cable TV line, telephone line, or ADSL line; or wireless, such as infrared radiation (IrDA, remote control), Bluetooth (Registered Trademark), 802.11 wireless, HDR, mobile telephone network, satellite line, or terrestrial digital network. The present invention encompasses a computer data signal embedded in a carrier wave in which the program code is embodied electronically.

The following descriptions are additional remarks of an electronic device in accordance with the present invention.

It is preferable that the electronic device in accordance with the present invention further includes state determination means for determining whether or not the sound output section and the sound input section are in the reference state, the volume determination means determines whether or not the input volume is lower than the estimated volume after the state determination means determines that the sound output section and the sound input section are in the reference state.

According to the above configuration, the state determination means determines whether or not the sound output section and the sound input section are in the reference state. The volume determination means determines whether or nor not the input volume is lower than the estimated volume after the state determination means has determined that the sound output section and the sound input section are in the reference state.

That is, the volume determination means determines, at least one time, whether or not the input volume is lower than the estimated volume, the volume determination means performing the determination only when a state in which there is no object which blocks a sound outputted from the sound output section and is to be collected by the sound input section is present.

This makes it possible to prevent a malfunction caused by a user who has unintentionally covered the sound output section or sound input section in a case where, for example, each of the sound output section and the sound input section is caused to serve as an operation section.

The electronic device in accordance with the present invention is preferably configured such that the state determination means determines that the sound output section and the sound input section are in the reference state if the input volume measured by the input-volume measuring means is substantially equal to the estimated volume estimated by the feedback-volume estimating means.

With the above configuration, the state determination means determines that the sound output section and the sound input section are in the reference state if the input volume measured by the input-volume measuring means is substantially equal to the estimated volume estimated by the feedback-volume estimating means.

As described earlier, the estimated volume is volume estimated by predicting volume of a sound outputted from the sound output section and is to be inputted into the sound input section in the reference state. Accordingly, if the input volume measured by the input-volume measuring means is equal to the estimated volume, it is considered that the input volume was measured in the reference state.

This makes it possible for the state determination means to determine whether or not the input volume measured by the input-volume measuring means is substantially equal to the estimated volume estimated by the feedback-volume estimating means, thereby can accurately determine whether or not the input volume measuring means is in the reference state when the input measuring means carries out measurement.

The electronic device in accordance with the present invention is preferably configured such that the state determination means determines that the sound output section and the sound input section are in the reference state after a predetermined period has passed since the sound output section started the sound output.

In a case where each of the sound output section and the sound input section is caused to serve as the operation section, a user may intentionally block one of the sound output section and the sound input section when the operation sections start working. As an example of such a case in which each of the sound input section and the sound output section is caused to serve as the operation section when the electronic device receives a call as described above, a user is likely to hold the electronic device with covering one of the sound output section and the sound input section when the electronic device receives a call because the user usually cannot know when the electronic device will receive a call.

Accordingly, as described earlier, the state determination means determines that the sound output section and the sound input section are in the reference state after the predetermined period has passed since the sound output section started outputting a sound. Accordingly, the volume determination means determines whether or not the input volume is lower than the estimated volume after the predetermined period has passed since the sound output section started outputting the sound. This makes it possible to cause each of the sound output section and the sound input section to serve as the operation section after the predetermined period has passed since the sound output section started outputting the sound.

Accordingly, this configuration makes it possible to prevent with a simple process a malfunction caused by a user who unintentionally has covered one of the sound output section and the sound input section.

The electronic device in accordance with the present invention is preferably configured such that the device function control means carries out a predetermined second process if the state determination means determines that the sound output section and the sound input section are not in the reference state.

With the above configuration, the device function control means carries out a predetermined second process if the state determination means determines that the sound output section and the sound input section are not in the reference state.

Note, that, for example, the second process is assumed to be a process which notifies a user that the sound output section and the sound input section are not in the reference state. In such a case, if the state determination means has determined that the sound output section and the sound input section have not been in the reference state, the device function control means can notify a determination result to the user. This makes it possible to urge the user to restore the reference state of the sound output section and the sound input section.

Furthermore, for example, in a case where the electronic device is a portable phone, the predetermined second process is assumed to be a process that the portable phone raises volume of a ringtone while receiving a call. In such a case, if the state determination means has determined that the sound output section and the sound input section have not been in the reference state, the device function control means raises the volume of the ringtone while the portable phone is receiving a call.

An example of such a state in which the sound output section and the sound input section are not in the reference state includes a state in which the sound output section is covered with an object. In such a case, even though the portable phone has been receiving a call, its ringtone is less likely to reach a user. Note, however, that, in such a case, it is desirable to notify to the user first that the portable phone is receiving the call, instead of notifying the user that the sound output section and the sound input section are not in the reference state.

Accordingly, if the state determination means has determined that the sound output section and the sound input section have not been in the reference state since the portable phone received a call, the device function control means raises the volume of the ringtone. This makes it possible to more certainly notify that the portable phone is receiving the call to a user who does not know that the portable phone is receiving a call.

The electronic device in accordance with the present invention is preferably configured such that the input-volume measuring means measures, among sounds inputted into the sound input section, volume of a sound having the same frequency component as a sound outputted from the sound output section.

With the above configuration, the input-volume measuring means measures, among sounds inputted into the sound input section, volume of a sound having the same frequency component as the sound outputted from the sound output section. Accordingly, even in a case where the sound input section collects sounds outputted from other than the sound output section, the input-volume measuring means can only extract the sound outputted from the sound output section and measure volume of the sound.

Accordingly, for example, even in a case where a sound is outputted from another sound source or a noise occurs in the vicinity of the electronic device, it is possible for the state determination means accurately to determine whether (i) there is an object which blocks a sound outputted from the sound output section between the sound output section and the sound input section, or (ii) the sound output section and the sound input section are in the reference state.

INDUSTRIAL APPLICABILITY

The present invention is applicable to electronic devices including a sound output section and a sound input section.

REFERENCE SIGNS LIST

1 Portable phone (electronic device)
11 Control section
12 Storage section
16 Sound output section
17 Sound input section
21 Function control section (device function control means)
22 Output-sound control section
23 Input-volume measuring section (input-volume measuring means)
24 Feedback-volume estimating section (feedback-volume estimating means)
25 State determination section (state determination means)
26 Volume determination section (volume determination means)

The invention claimed is:

1. An electronic device including a sound output section and a sound input section, comprising:
   a storage device; and
   a central processing unit performing steps of:
   (a) measuring input volume, which is volume of a sound inputted into the sound input section while the sound output section is performing sound output;
   (b) estimating estimated volume in a reference state, estimated volume being volume of a sound outputted from the sound output section and is to be inputted into the sound input section, and the reference state being a state in which there is no object which blocks the sound outputted from the sound output section and is to be collected by the sound input section in a predetermined range defined by a position of one of the sound output section and the sound input section;
   (c) determining whether or not the input volume measured in step (a) is lower than the estimated volume estimated in step (b); and
   (d) carrying out a predetermined first process if the volume determination section step (c) determines that the input volume is lower than the estimated volume.

2. An electronic device as set forth in claim 1, the central processing unit further comprising:
   state determination section that determines whether or not the sound output section and the sound input section are in the reference state,
   the volume determination section determines whether or not the input volume is lower than the estimated volume after the state determination section determines that the sound output section and the sound input section are in the reference state.

3. The electronic device as set forth in claim 2, wherein the state determination section determines that the sound output section and the sound input section are in the reference state if the input volume measured by the input-volume measuring section is substantially equal to the estimated volume estimated by the feedback-volume estimating section.

4. The electronic device as set forth in claim 3, wherein the device function control carries out a predetermined second process if the state determination section determines that the sound output section and the sound input section are not in the reference state.

5. The electronic device as set forth in claim 2, wherein the state determination section determines that the sound output section and the sound input section are in the reference state after a predetermined period has passed since the sound output section started the sound output.

6. The electronic device as set forth in claim 1, wherein the input-volume measuring section measures, among sounds inputted into the sound input section, volume of a sound having the same frequency component as a sound outputted from the sound output section.

7. A method for controlling an electronic device including a sound output section and a sound input section, the method comprising the steps of:
 (a) measuring input volume, which is volume of a sound inputted into the sound input section while the sound output section is performing sound output;
 (b) estimating estimated volume in a reference state, estimated volume being volume of a sound outputted from the sound output section and is to be inputted into the sound input section, and the reference state being a state in which there is no object which blocks the sound outputted from the sound output section and is to be collected by the sound input section in a predetermined range defined by a position of one of the sound output section and the sound input section;
 (c) determining whether or not the input volume measured in the step (a) is lower than the estimated volume estimated in the step (b); and
 (d) carrying out a predetermined first process if the step (c) determines that the input volume is lower than the estimated volume.

8. A non-transitory computer-readable recording medium in which a control program is stored which is for operating an electronic device, wherein the electronic device includes a sound output section, a sound input section, and a central processing unit; and
 the control program causes the central processing unit of the electronic device to perform the steps of:
 (a) measuring input volume, which is volume of a sound inputted into the sound input section while the sound output section is performing sound output;
 (b) estimating estimated volume in a reference state, estimated volume being volume of a sound outputted from the sound output section and is to be inputted into the sound input section, and the reference state being a state in which there is no object which blocks the sound outputted from the sound output section and is to be collected by the sound input section in a predetermined range defined by a position of one of the sound output section and the sound input section;
 (c) determining whether or not the input volume measured in step (a) is lower than the estimated volume estimated in step (b); and
 (d) carrying out a predetermined first process if step (c) determines that the input volume is lower than the estimated volume.

* * * * *